United States Patent
Meir (12) 
(10) Patent No.: US 6,822,861 B2
(45) Date of Patent: Nov. 23, 2004

(54) ACTIVE COOLING SYSTEM FOR CPU AND SEMICONDUCTORS ALSO ENABLING THERMAL ACCELERATION

(75) Inventor: Ronen Meir, Ashkelon (IL)

(73) Assignee: Active Cool Ltd., Ashkelon (IL)

( * ) Notice: Subject to any disclaimer, the term of this patent is extended or adjusted under 35 U.S.C. 154(b) by 212 days.

(21) Appl. No.: 10/275,979

(22) PCT Filed: May 22, 2001

(86) PCT No.: PCT/IL01/00462
§ 371 (c)(1),
(2), (4) Date: Nov. 19, 2002

(87) PCT Pub. No.: WO01/90866
PCT Pub. Date: Nov. 29, 2001

(65) Prior Publication Data
US 2003/0117760 A1 Jun. 26, 2003

(30) Foreign Application Priority Data
May 22, 2000 (IL) .............................. 136275

(51) Int. Cl.[7] ............................................. H05K 7/20
(52) U.S. Cl. ....................... 361/695; 361/687; 454/184; 165/185; 165/127
(58) Field of Search ................................ 361/686–689, 361/692–704, 717–719, 720–724; 454/184; 165/80.2, 80.3, 121–126, 185; 257/722–727; 174/16.1, 16.3, 252, 15.2; 415/177, 178, 213.1, 214.1; 62/3.2, 3.3, 3.7, 259.2, 159, 126; 364/550, 557, 707

(56) References Cited

U.S. PATENT DOCUMENTS

| | | | |
|---|---|---|---|
| 5,419,780 A | 5/1995 | Suski | |
| 5,422,787 A | 6/1995 | Gourdine | |
| 5,501,076 A | 3/1996 | Sharp et al. | |
| 5,737,923 A * | 4/1998 | Gilley et al. | 62/3.7 |
| 5,986,883 A | 11/1999 | Johnson et al. | |
| 6,173,576 B1 | 1/2001 | Ishida | |
| 6,345,507 B1 * | 2/2002 | Gillen | 62/3.7 |
| 6,452,797 B1 * | 9/2002 | Konstad | 361/695 |
| 6,671,177 B1 * | 12/2003 | Han | 361/719 |
| 6,717,811 B2 * | 4/2004 | Lo et al. | 361/698 |
| 6,723,917 B1 * | 4/2004 | Wang | 174/35 GC |

* cited by examiner

Primary Examiner—Michael Datskovsky
(74) Attorney, Agent, or Firm—Dennison, Schultz, Dougherty & MacDonald (57) ABSTRACT

An active cooling system for the CPU of a computer having computer slots and motherboard, the cooling system including a card arranged to sit in a computer slot coupled to the motherboard and powered directly from mains via the computer slot, the card including a hot air outlet passage from inside the computer to outside the computer; a cooling-CPU unit including a thermoelectric component (TEC) couplable to mains for power supply, a cold side heat sink coupled to the TEC and in thermally conductive contact with a part of the CPU, a hot side heat sink coupled to the TEC, and a fan distanced from the hot side heat sink for pulling heated air from the hot side heat sink.

16 Claims, 9 Drawing Sheets

ACTIVE COOLING SYSTEM FOR CPU AND SEMICONDUCTORS ALSO ENABLING THERMAL ACCELERATION

FIELD OF THE INVENTION

The present invention relates to a device and method for active cooling of a computer microprocessor (CPU) to speed up the processor, and to solve heat problems.

BACKGROUND OF THE INVENTION

Processor power, and therefore speed, is increasing rapidly. From the beginning of personal computers and until now, the trend of CPU increasing temperature is clear.

The first processor models, such as XT, 286, 386 didn't need any thermal solutions. Their power consumption and therefore temperature was low. When the 486 came out, it needed a small heat sink [aluminum plate attached to the CPU] to decrease and remove the heat. The heat is increased due to the number of transistors, also called CMOS devices, located on the silicone wafer, and increasing switching speed. Each CPU model had several versions of switching speed, and the switching speed and temperature are correlated.

The Pentium CPU needed a heat sink and a fan. Thus, a whole new market of passive cooling solutions emerged. Pentium II models came out with a different structure, with increasing power and heat. This CPU [and others such as the AMD Athlon CPU model] needed a very large heat sink and fan, and sometimes two fans or more. The trend of rising heat continued.

The heat of a CPU reduces its reliability, and therefore the reliability of the entire computer system, and affects the switching speed. Therefore, decreasing the CPU temperature will allow increasing of the switching speed. These phenomena are known as thermal acceleration.

The above described conventional cooling systems are all passive systems. This means that they remove heat from the CPU of the computer system, but do not actively input cold in order to actively cool the CPU and reduce the temperature of the CPU below ambient surrounding temperature. At present, passive cooling solutions are close to their limit. A new solution and approach are needed.

An attempt was made by Marlow Industries, Inc., Dallas, Tex., USA, to provide active cooling in its Model ST3404 PC chip cooler in May 1996. This simple device included a DT12-4 Thermoelectric cooler with a small heat sink, mounted adjacent a PC chip, and coupled to the motherboard. It provided heat dissipation up to 10 Watts and power input should not exceed 5 Volts DC, according to the manufacturer's data sheet. The disadvantages of this device are that the total power of heat dissipation is very low, in terms of present day CPU requirements, and that is powered by the limited power of the power supply of the computer, so cannot receive sufficient power to dissipate more heat.

In addition, this TEC unit is inefficient, and therefore produces even more heat inside the computer enclosure, which heats other heat sensitive components, such as the hard drive, memory, chip set, etc.

Furthermore, when the computer is turned off or in the case of a power cut, a fast changing temperature vs. time often results in thermal shock, which could change characteristics of the CPU, reduce reliability. At the time, these were not a serious problems, as the change in temperature as a result of cooling was not very large, the thickness of the CPU silicon wafer was relatively large, and many fewer transistors were used than are in use at present and/or are expected to be used in CPU's in the future. Another problem which arises when switching the unit off, is that the fast rise in temperature can cause water condensation in the unit's cold side, which can lead to serious problems. Yet another problem is that the heat built up on the hot side of the thermoelectric module must be removed from the PC box. [While applying cooling to the CPU, the hot side of the thermoelectric-component is much hotter because of its low efficiency, around 30 percent]. Because of these disadvantages, and due to the changes in CPU power requirements, which could not be satisfied by this unit, this model ceased to be marketed some two years ago, as larger passive cooling systems were more efficient than this small active cooling system.

Another computer including an internal cooling system has been proposed by KryoTech, Inc., of West Colombia, S.C., USA. This computer utilizes a vapor phase cooling method, and includes a compressor and condenser with gas and moving mechanical parts mounted inside the computer. This cooling system increases the overall size of the computer by some 30–40%. Kryotec markets an accelerated speed computer, not a generic solution. Also Kryotech requires a special turn-off procedure to avoid thermal shock and condensation. This procedure must be followed by a human user, which can lead to mistakes and damage.

The present invention described below is a complete system that solves all the problems mentioned. In particular, it is a generic device, which can be mounted in any PC.

SUMMARY OF THE INVENTION

According to the present invention, there is provided an active cooling system for the CPU of a computer having computer slots and a motherboard, the cooling system including a card arranged to sit in a computer slot coupled to the motherboard, the card including a hot air outlet passage from inside the computer to outside the computer, a cooling-CPU unit including: a thermoelectric component (TEC) couplable via the card to the mains for power supply; a cold side heat sink coupled to the TEC by a aluminum or copper adapter/extender and in thermally conductive contact with a part of the CPU; a hot side heat sink coupled to the TEC; and a fan distanced from the hot side heat sink for pulling heated air from said hot side heat sink, and a flexible hose coupled between the fan and the hot air inlet passage on the card.

BRIEF DESCRIPTION OF THE DRAWINGS

The present invention will be further understood and appreciated from the following detailed description taken in conjunction with the drawings in which.

DETAILED DESCRIPTION OF THE INVENTION

The invention described herein is an active cooling system for a CPU and semiconductors enabling thermal acceleration of the CPU, and uses a Thermoelectric Cooler (TEC) component, a component based on the Paltier effect and well-known in tie relevant industry. When electrical DC power is supplied to the TEC component, one side of the component becomes very cold and the other side very hot (partly because of heat pulled from the CPU itself, and partly due to the low efficiency of the TEC component which generates additional heat). In operation, the component actually pumps heat from the cold side to the hot side. The Thermoelectric component has a low efficiency, and demands high power for operation, which is the reason TEC's were generally not considered to be useful for cooling CPU's and other heat producing components. There are many models of Thermoelectric coolers, each with different characteristics and requiring a different power input. For an advanced CPU, a high power thermoelectric component is needed.

Figure 1:
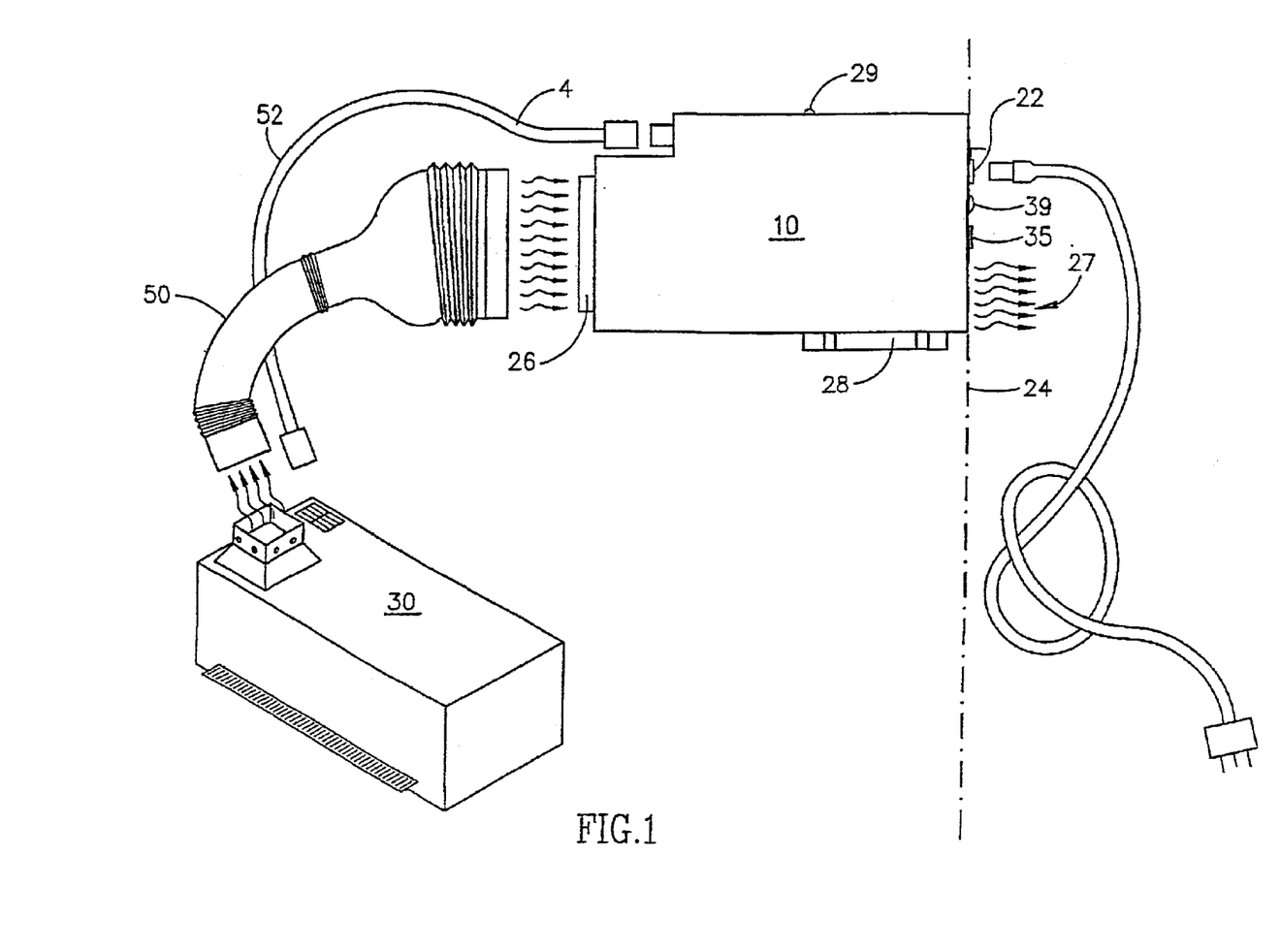
FIG. 1 is a schematic illustration of an active cooling system for a computer CPU constructed and operative in accordance with one embodiment of the present invention.
Figure 2:
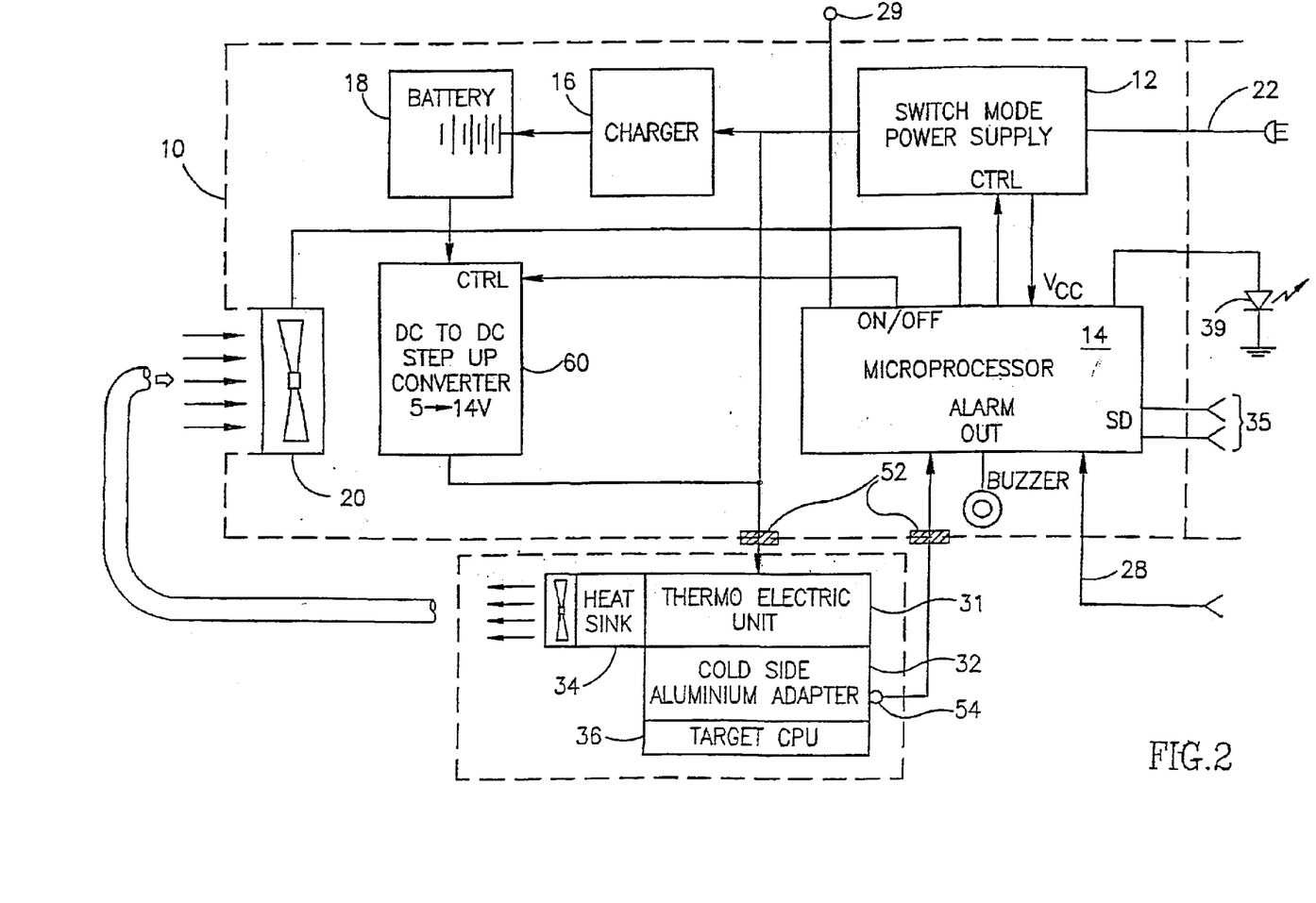
FIG. 2 is a block diagram illustration of the connections between the subsystems of the system of FIG. 1.

Referring now to FIGS. 1 and 2, there are shown respective schematic and block diagram illustrations of a cooling system for a computer CPU constructed and operative in accordance with one embodiment of the present invention. The cooling system of the present invention consists of three-parts:

1. A PCI or ISA card 10. One example of a suitable card 10 is shown schematically in detail in FIG. 3. Card 10 includes a low-profile switch mode mains operated power supply 12 with a high frequency ferrite or planar transformer, microprocessor control unit 14, battery charger 16, rechargeable batteries 18, a fan 20, a main power connector 22 located on metal bracket 24, and a connection 26 to a flexible air pipe. A second PCB 28 is mounted on card 10 and serves as a connector to the PC extension slot (not shown) on the motherboard. An enclosure temperature sensor 29 is provided seated on card 10.

Figure 5:
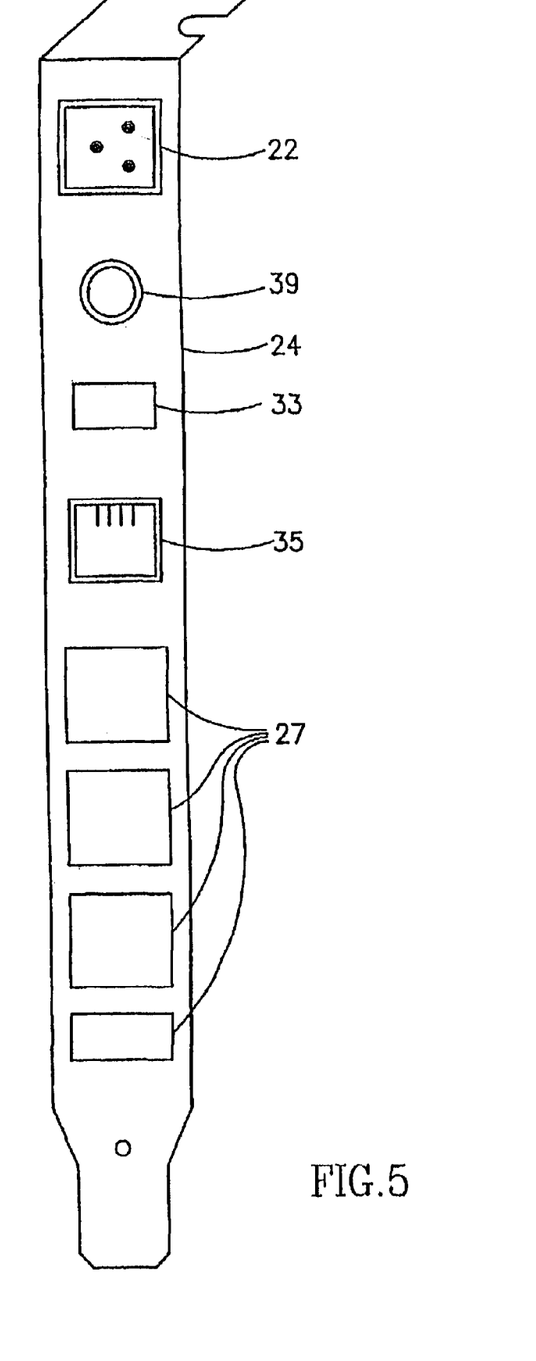
FIG. 5 is a front view of one embodiment of a metal bracket according to the present invention.

Card 10 is preferably internally split into two sections, as by a separator 19. In this case, half of the card is used for the electronics and batteries, and the other half is used for air passage between the back of the card (inside of the computer), the fan 20 and the metal bracket 24 leading through a hot air outlet 27 to the environment. A front view of one embodiment of a bracket 24 is shown in FIG. 5. As can be seen, bracket 24 includes mains power connector 22 and an LED 39 which indicates when the thermoelectric unit is operating. Preferably LED 39 is a blue LED to indicate Cold. It is possible to utilize a flashing LED to indicate operational parameters.

Figure 4:
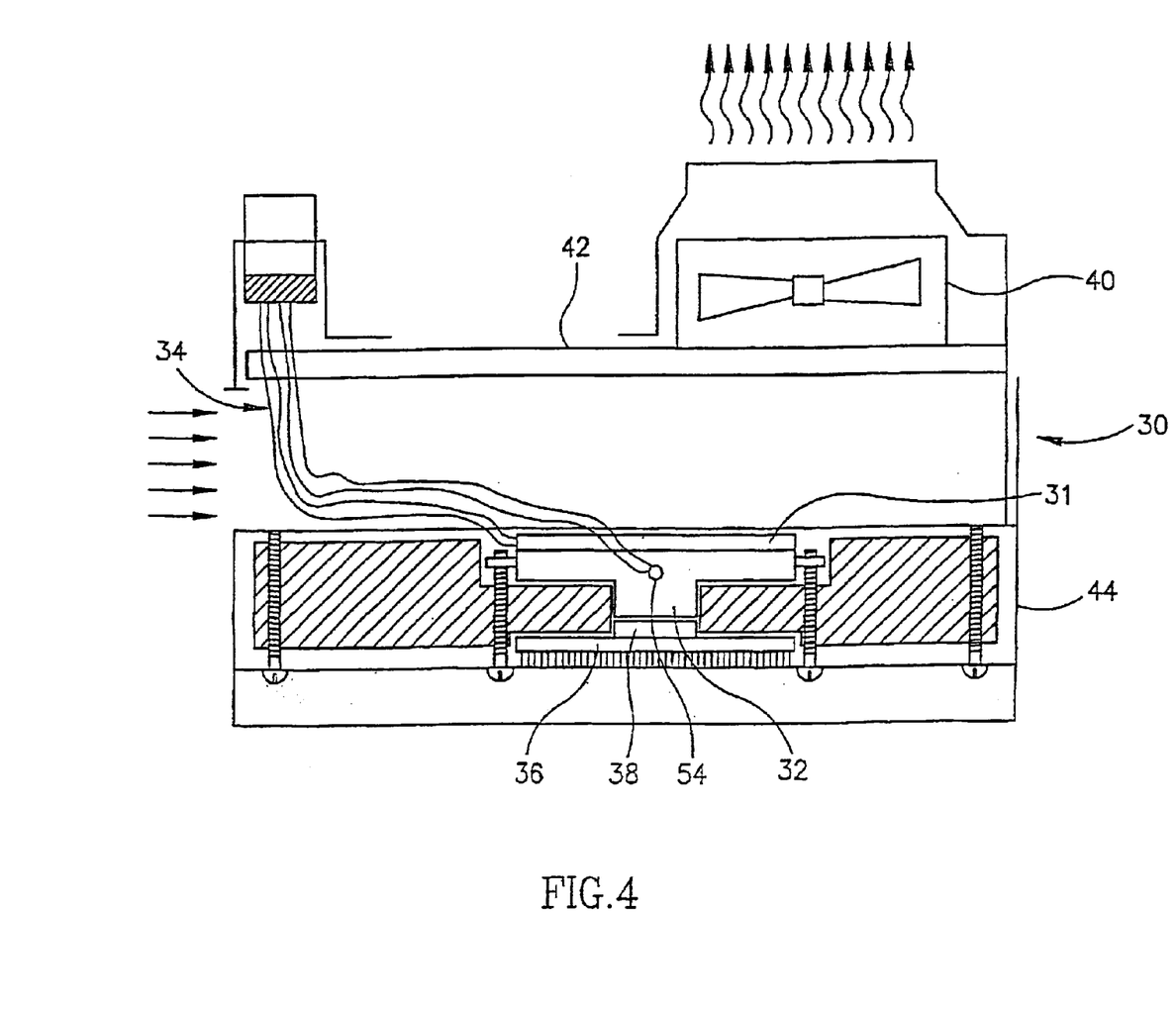
FIG. 4 is a schematic sectional illustration of a CPU and attached TEC cooling unit according to one embodiment of the invention.

2. A cooling-CPU unit 30, with a CPU connector to the mother board (not shown). One embodiment of a suitable cooling-CPU unit 30 is illustrated in FIG. 4. Cooling-CPU unit 30 includes a thermoelectric component 31, such as DT12-6 manufactured by Marlow Industries, Inc., or CP1.4-127-06L manufactured by Melcor, US. Thermoelectric component 31 is coupled via a thermally conductive material or compound to a cold side heat sink 32 and a hot side heat sink 34. Cold side heat sink 32, here illustrated as an aluminum or copper adapter/extender, can have any desired shape, depending on the contact area of the CPU and the thermoelectric component 31. The adapter also extends the distance from the hot side heat sink allowing insertion of thermal insulation material. The cold side heat sink 32 is attached to a target CPU 36 using a thermally conductive material 38, such as silicon paste. A fan 40 is mounted on an elevated frame 42 distanced somewhat from the hot side heat sink 34. Fan 40 pulls ambient air from the computer enclosure into fins of the hot side heat sink 34. The heated air is pulled out by fan 40 into a rubber pipe connected to the card 10. The whole unit is mounted in a box 44. Box 44 is sealed from all directions except for air inlet openings adjacent the hot side heat sink 34. It will be appreciated that the shape of box 44 can be any shape required, depending upon the shape and method of mounting of the CPU on the motherboard, and CPU model and manufacturer.

It will be appreciated by those skilled in the art that a cascade of thermoelectric components can be utilized in cases requiring improved heat pumping action. In this case, a cascade of two or more thermoelectric components can be provided coupled to one another. Needless to say, such a cascade will also require a greater input power in order to operate.

Figure 3:
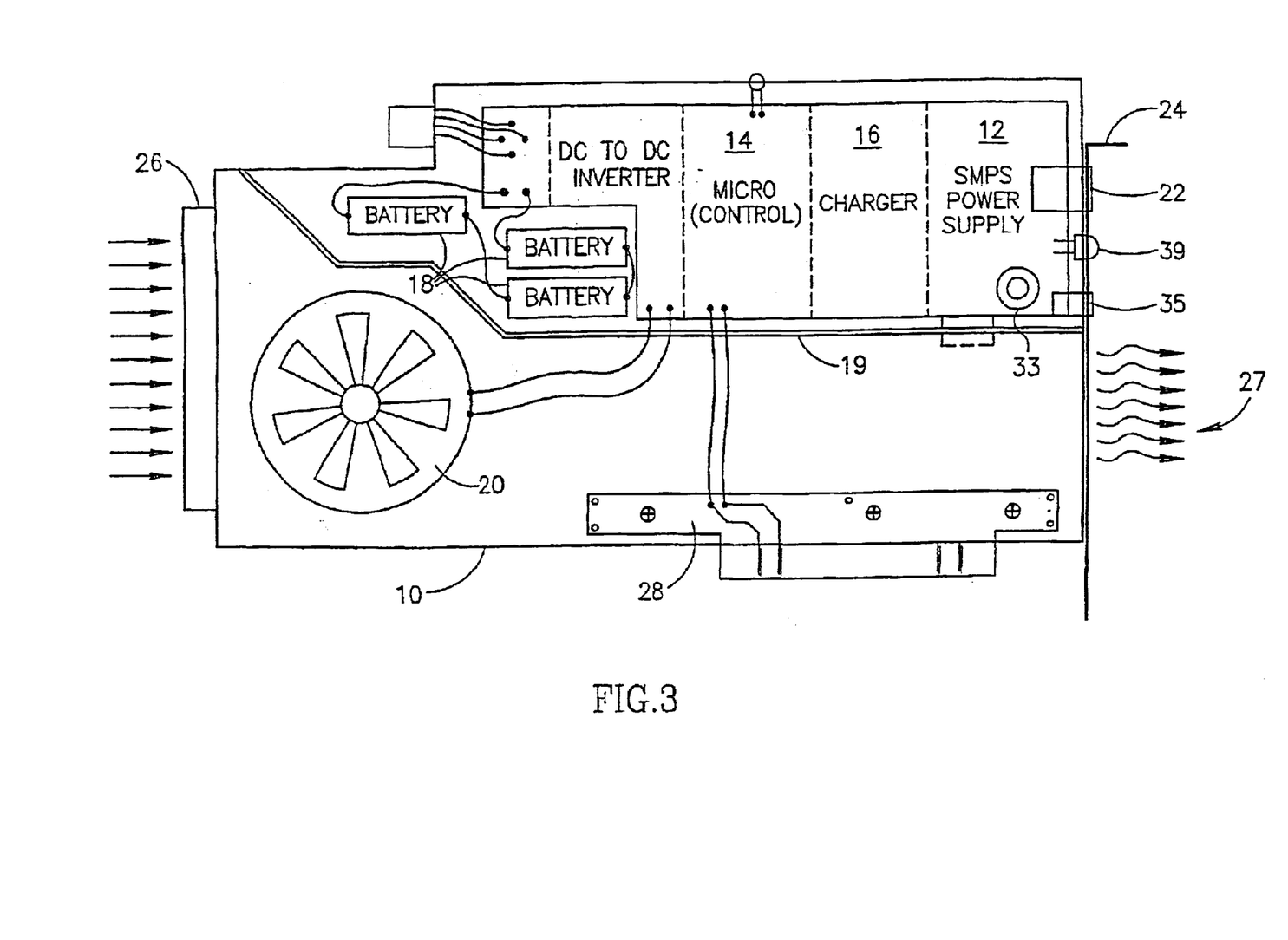
FIG. 3 is a schematic illustration of a PCI or ISA card constructed and operative in accordance with one embodiment of the invention.

Preferably, a buzzer 33 is provided close to bracket 24 in order to provide an audible indication of system status. Similarly, a connector 35 may be provided for output to an RS232 or USB for automatic shutdown of the PC in case the temperature of the CPU rises above a pre-determined threshold. In this case, a CPU temperature sensor 54 is coupled to the microprocessor control unit 14 which, in turn, sends a shut down message to the computer via the card microprocessor.

3. A flexible pipe 50 is connected between the card 10 and the thermoelectric unit 30. Flexible pipe 50 can be formed of any suitable flexible material, such as rubber or plastic. Flexible pipe 50 can be bent in any direction required to fit it and the thermoelectric unit into the computer enclosure. An electrical connector 52 is also connected between the card 10 and the thermoelectric unit 30. According to the illustrated embodiment, connector 52 is a four wire connector, although a different number of wires can be utilized, such as when coupling to more than one thermoelectric unit and/or sensors or to deliver DC voltage to the CPU to allow change of speed. When a four wire connector is utilized, two wires can be used to deliver power from the card, and the other two wires can be used for the output of a CPU temperature sensor 54. Temperature sensor 54 measures CPU temperature and delivers data to the processor located on the card. According to one embodiment of the invention, the temperature sensor 54 is coupled to a digital display on the bracket 24 or inside the cooling-CPU unit 30 to provide a visual display of the CPU temperature. According to another embodiment, an external auxiliary temperature measuring devices can be utilized to display or read the temperature of the CPU via temperature sensor 54.

The method of operation of the cooling system of the present invention is as follows. Card 10 is inserted into an available PC slot, occupying only one slot, and accepts mains power via the metal bracket 24 and connector 22. The mains power enters the switch mode power supply 12 [low-profile using planar transformer]. The switch mode power supply inverts the AC power to a low DC power needed for the Thermo electric module, while providing fully isolation between mains and DC power. According to a preferred embodiment, the power components of the switch mode power supply extend into the hot air outlet passage. In this way, the power components can also be cooled by air in the outlet passage.

The card senses the existing voltage of the PC, so if the card power cord is not connected and the PC is switched on, alarm 33 will sound a warning to the user that the cooling unit is not connected.

Figure 7:
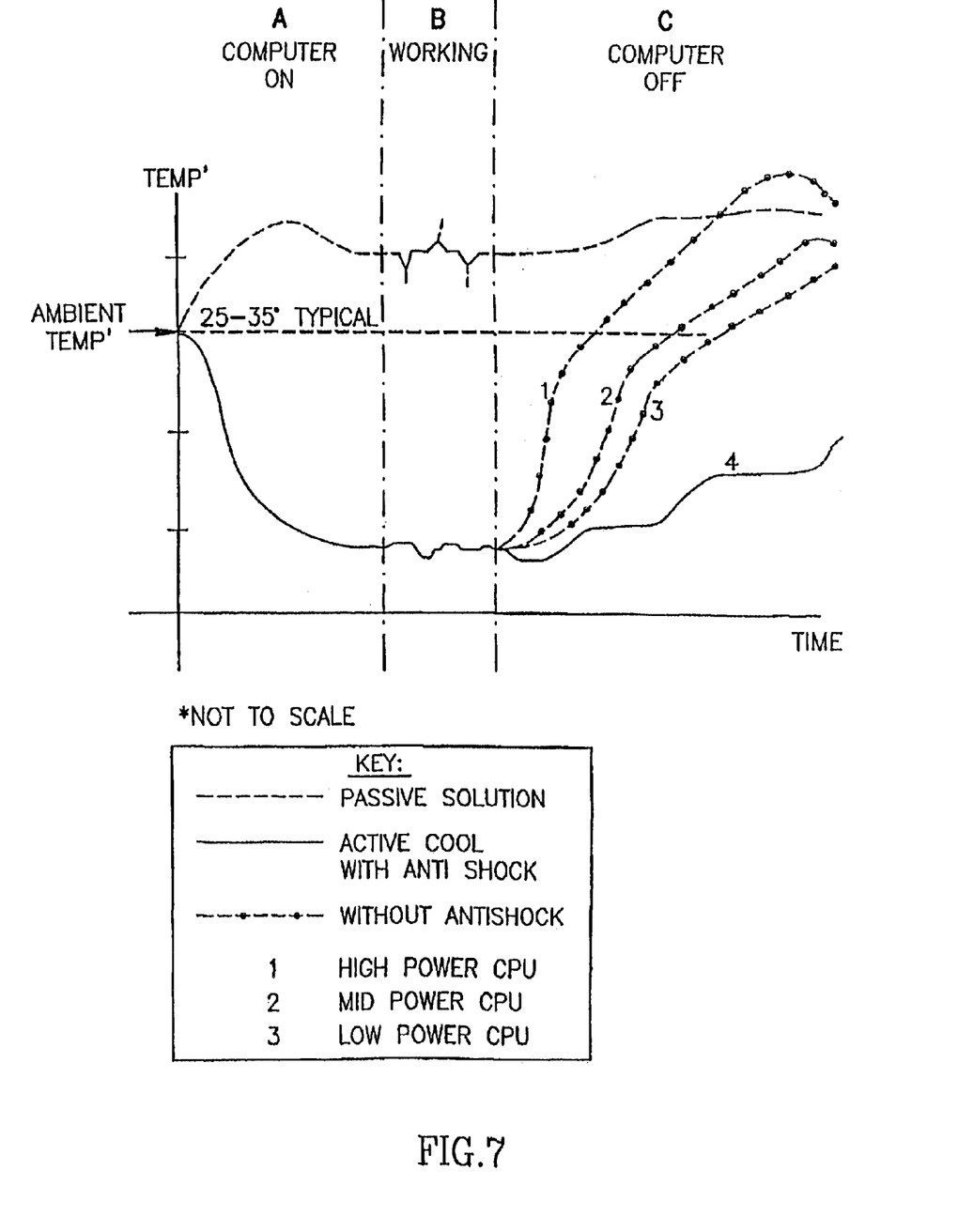
FIG. 7 is a graph depicting the active cooling action of the device of the present invention as compared with passive cooling systems.

The microprocessor control unit 14 inside card 10 controls the cooling curve, maintaining the temperature curve in a way to prevent thermal shock when turning on the PC. A graph illustrating typical temperature curves is shown in FIG. 7. If the PC while operating is unplugged from the mains or no electricity is present due to power failure, the batteries 18 on the card will provide backup power. In order to save space and cost, only a few batteries, generally 1 to 6 cells, preferably 4, are used, generating low voltage. This low voltage is not enough to power the thermoelectric component. Therefore, this voltage enters a DC to DC step up converter 60, or any other method, that converts the low battery voltage to suitable voltage and power for the thermoelectric component upon command from microprocessor control unit 14. This system will allow the thermoelectric component to continue to work a few minutes while the microprocessor control unit 14 of card 10 slowly reduces battery voltage according to a desired curve and algorithm, as shown in FIG. 7. When the temperature of the cold side of the thermoelectric component is increased according to this curve by command of microprocessor control unit 14, it will prevent thermal shock and water condensation. The temperature of the cold side is measured by CPU temperature sensor 54 located on the cold side of the thermoelectric component. Via a connector, this information is delivered to the card microprocessor 14. The CPU temperature can be controlled accurately by is controlling the switch mode power supply by the card microprocessor according to the sensor temperature measured.

When the computer is turned on, the cooling-CPU unit is turned on when it senses 5 Volts on the card connector 28. The cooling-CPU unit is turned on to maximum power to provide cooling to the CPU. Ambient air from the computer enclosure is pulled into the hot side heat sink of thermoelectric component 31. As CPU 31 generates heat, this heat is immediately pumped from the CPU via the cold side of the thermoelectric component and into the hot side heat sink. As air passes through the hot side heat sink fins, it absorbs the heat from the heat sink fins. The heated air is removed from the cooling-CPU unit by fan 40 and pushed into flexible pipe 50. From flexible pipe 50, the heated air passes through the hot air passage in card 10, and is ejected outside the computer enclosure via hot air outlet 27 in metal bracket 24. This prevents generation of unwanted heat inside the PC enclosure, that contains other heat sensitive components [hard drive, chipset, memory, etc]

Also it may be possible to operate the system without removing the heated air from the PC enclosure. In this case, it is preferable to provide other means of cooling the PC enclosure.

Figure 6:
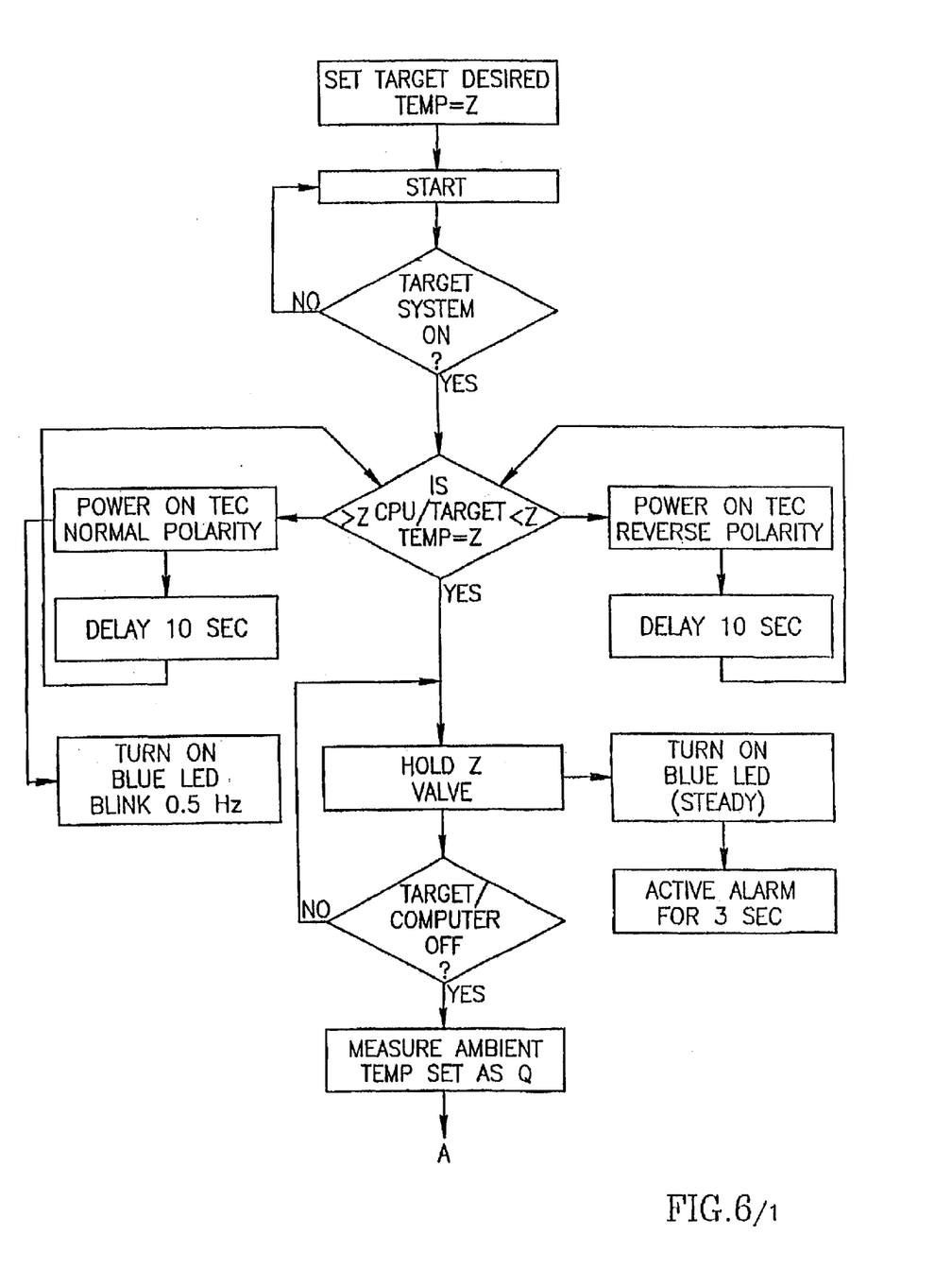
FIG. 6 is a flow chart of operation of the TEC cooling unit according to one embodiment of the present invention.

There is shown in FIG. 6 a flow chart of the operation of microprocessor control unit 14. As can be seen, this includes normal operating procedure, i.e., when the computer is on, as well as special automatic temperature control procedure when the computer has been turned off. It will be appreciated that the cooling system of the present invention is also operative to raise the temperature of the CPU, when required. Thus, if the computer is operating under very cold conditions, and the temperature of the CPU falls below a pre-defined threshold, the polarity of the thermoelectric component is reversed, thereby providing heat pumping into the CPU instead of out from the CPU.

A graph indicating the difference in temperature curves between the system of the present invention with anti-thermal shock control (solid line), the present invention without anti-shock control (C1, C2, C3), as compared with a passively cooled CPU (broken lines), is shown in FIG. 7.

It is a particular feature of the present invention that the thermoelectric component is powered by an independent power supply, i.e., mains or batteries, and not by the power supply of the PC. This permits the use of a relatively high power cooling element, a thermoelectric cooler, in order to reduce the temperature of a CPU substantially below the ambient temperature, which is not possible in any conventional cooling system. This reduction in temperature permits greatly increased processing speeds known as thermal acceleration of the CPU (CMOS devices).

It is a further particular feature that the microprocessor control unit provides automatic control of the temperature curve, so as to prevent thermal shock and condensation during shut off.

Figure 8:
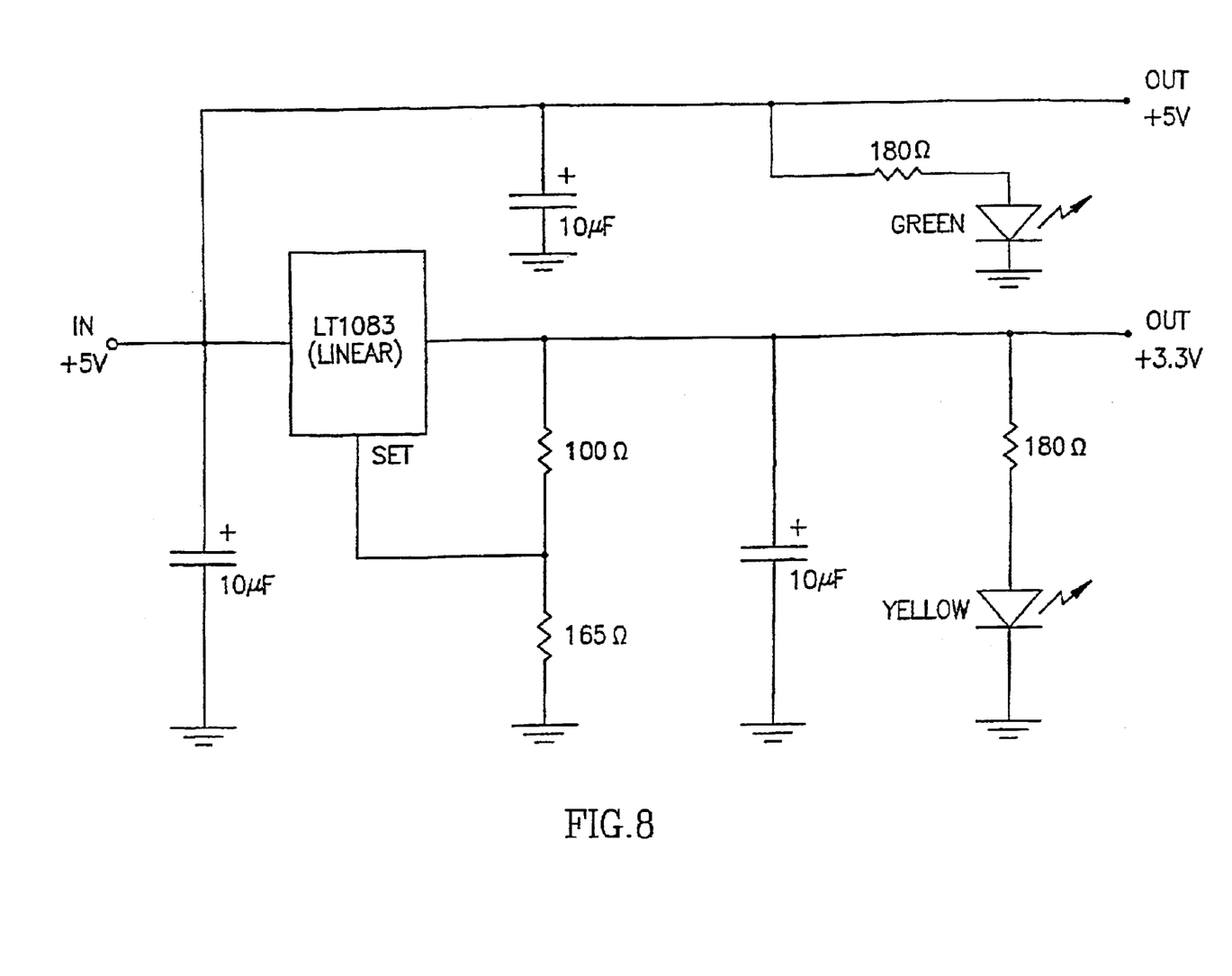
FIG. 8 illustrates operation of inverters according to one embodiment of the invention.

FIG. 8 illustrates the operation of the inverters. Either operation by the batteries. Or 5 Volt is taken from the computer bus and 5V and 3.5 Volts are output. This permits the speed of the CPU to be greatly increased. By changing CPU frequency multiplier (such as connecting this voltage to AMD Athlon processor edge connector), the voltage supplied at selected points will change CPU speeds.

It will be appreciated that the invention is not limited to what has been described hereinabove merely by way of example. Rather, the invention is limited solely by the claims which follow.

What is claimed is:

1. An active cooling system for the CPU of a computer having computer slots and a motherboard, the cooling system comprising:
    a card arranged to sit in a computer slot coupled to the motherboard and powered directly from mains via said computer slot, the card including a hot air outlet passage from inside the computer to outside the computer;
    a cooling-CPU unit including:
        a thermoelectric component (TEC) couplable to mains for power supply;
        a cold side heat sink coupled to said TEC and in thermally conductive contact with a part of the CPU;
        a hot side heat sink coupled to said TEC; and
        a fan distanced from said hot side heat sink for pulling heated air from said hot side heat sink.

2. The active cooling system of claim 1, further comprising a flexible hose coupled between said fan and said hot air outlet passage.

3. The active cooling system of claim 1, wherein said card includes a high power power supply, independent of an internal computer power supply.

4. The active cooling system of claim 3, wherein said card further includes batteries to provide back-up power in case of a power failure, to prevent thermal shock and water condensation.

5. The active cooling system of claim 1, further comprising a microprocessor in said cooling-CPU unit arranged to control temperature of the CPU by controlling operation of said TEC.

6. The active cooling system of claim 5, wherein said cooling-CPU unit further includes a temperature sensor for providing an output indication of CPU temperature to said microprocessor.

7. The active cooling system of any of the preceding claims, further comprising an alarm operative when said card and cooling-CPU unit are not receiving mains power but the computer is switched on.

8. The active cooling system of claim 2, further comprising a metal bracket for mounting said card in the slot, said bracket including a connector for providing mains power to said card SMPS AC/DC inverter that provides power to the active cooling system.

9. The active cooling system of claim 8, wherein said mains power is provided to a low-profile switch mode power supply occupying one computer slot.

10. The active cooling system of claim 9, wherein said low-profile switch mode power supply includes a planar transformer.

11. The active cooling system of claim 10, wherein power components of said switch mode power supply extend into said hot air outlet passage to provide cooling of said power components.

12. The active cooling system of any of the preceding claims, further comprising a visual display of CPU temperature.

13. The active cooling system of any of the preceding claims, further comprising a blue LED for providing an indication of operation of the system.

14. The active cooling system of any of the preceding claims, further comprising an extender on said cold side heat sink providing larger distance between the CPU and said hot side heat sink.

15. The active cooling system of any of the preceding claims, wherein the card is built into a custom PC power supply.

16. The active cooling system of claim 8, wherein said card works with an external DC source instead of an internal SMPS, by replacing the AC connector by a DC connector, and supplying DC voltage from an external power supply (linear or smps).

* * * * *